United States Patent [19]

Chapman et al.

[11] Patent Number: 5,663,648
[45] Date of Patent: Sep. 2, 1997

[54] GRADIENT COILS HAVING INCREASED PERFORMANCE AND DECREASED POWER CONSUMPTION FOR USE IN MR SYSTEMS

[75] Inventors: Barry L. W. Chapman, Orangeburg, N.Y.; Paul Glover, Gilford Surrey, England

[73] Assignee: British Technology Group USA, Inc., Gulph Mills, Pa.

[21] Appl. No.: 686,210

[22] Filed: Jul. 23, 1996

[30] Foreign Application Priority Data

Mar. 17, 1995 [FR] France ................... 95 03376

[51] Int. Cl.⁶ ............................................ G01V 3/00
[52] U.S. Cl. ................................... 324/322; 324/318
[58] Field of Search ........................ 324/322, 318, 324/314, 309, 307; 128/653.5

[56] References Cited

U.S. PATENT DOCUMENTS

| | | | |
|---|---|---|---|
| 4,978,920 | 12/1990 | Mansfield et al. | 324/318 |
| 5,245,287 | 9/1993 | Nowak et al. | 324/322 |
| 5,266,913 | 11/1993 | Chapman | 335/216 |
| 5,298,863 | 3/1994 | Nowak et al. | 324/322 |
| 5,311,136 | 5/1994 | Takahashi | 324/322 |
| 5,325,060 | 6/1994 | Mansfield et al. | 324/322 |

OTHER PUBLICATIONS

Turner, Minimum Inductance Coils, 1988, pp. 948–953.
Chapman, et al., *Jour. of Magnet. Reson.*, series B 107, pp. 152–157 (1995).
Chapman, et al., *Meas. Sci. Technolo.*, vol. 6, pp. 349–354 (1995).
Tootell, et al., *Nature*, vol. 375, pp. 139–141 (May 11, 1995).

*Primary Examiner*—Louis M. Arana
*Attorney, Agent, or Firm*—Plevy & Associates

[57] ABSTRACT

A gradient coil specifically designed to enhance the performance of Magnetic Resonance (MR) imaging and spectroscopy. In particular, the construction of gradient coils for use with resonant gradient power supplies to provide the necessary performance (large electromagnetic fields that can activated and deactivated rapidly) required in MR systems. These gradient coils require considerably less power than those presently employed for comparable performance and provide considerably more performance with existing power supplies. These coils are characterized by having a higher inductance than existing gradients of comparable size. Examples are given for the use of the invention in providing linear axial gradient field via a standard Maxwell gradient coil, with comparisons with existing coils.

22 Claims, 7 Drawing Sheets

GRADIENT COILS HAVING INCREASED PERFORMANCE AND DECREASED POWER CONSUMPTION FOR USE IN MR SYSTEMS

BACKGROUND OF THE INVENTION

1. Field of the Invention

The present invention relates generally to electromagnetic coils for Magnetic Resonance (MR) Systems and more particularly, to electromagnetic gradient coils having a higher inductance value for increasing performance and decreasing power consumption of existing MR resonant gradient power supplies.

2. Description of the Prior Art

A MR system consists of several major component subsystems, which include a main magnet, a gradient subsystem, a radio frequency (RF) reception and transmission subsystem, and a computer control system. A factor of considerable performance in Magnetic Resonance (MR) system performance is not the field strength produced by the main magnet, but the performance of the gradient subsystem. The field strength does however determine the frequency at which the system operates at and the signal to noise ratio of the MR signal. The introduction of MR systems in the mid-1970's resulted in an initial flourishing of electromagnetic coil design for the production of the main magnetic field. The most significant step in this field was the development of super-conducting technology that in a matter of ten years, raised the attainable field strength from 0.1 Tesla (T) to systems with fields over 1 T. The last ten years has seen the standard field strength rise to 1.5 T (15×the field of the first human MR imaging system at the University of Nottingham, UK), and the maximum field strength rise to 4.25 Tesla (System currently operational in the Columbia University). Today the field strengths continue to rise at a diminishing rate and the advantages, such as increased signal to noise ratio, rise commensurably slowly. Though, additional benefits, such as the ability to perform functional imaging, also accrue from utilizing higher magnetic fields.

During the last ten years the performance of MR systems has continued to increase dramatically, due to the improvements in the gradient subsystem, the development of new and improved techniques (many of which are highly dependent on the performance of the gradient subsystem, such as high speed imaging), and the technology in general (RF coil design, and computing power). The most significant of these developments has been related to the gradient subsystem, which determines the limitations of MR techniques, such as the resolution and the high speed imaging capability. Consequently, to a large degree, the gradient subsystem determines the diagnostic limitations of the MR system.

Major advances in two components of the gradient subsystem are responsible for this increased performance. First, the output of the power supplies contained in the gradient sub-system has increased considerably. Secondly, gradient coil design methods have also greatly enhanced MR imaging and spectroscopy. One of these new design techniques involves distributed designs for magnetic shielding, which eliminates the external field that would otherwise give rise to undesirable eddy currents and consequent field perturbations. This type of shielding is exemplified by U.S. Pat. No. 4,978,920 to Mansfield et al., entitled MAGNETIC FIELD SCREENS, issued on Dec. 18, 1990. Another new design technique involves providing magnetic fields of better linearity over larger fractions of the interior space, which is exemplified by U.S. Pat. No. 5,266,913 to Chapman, entitled SCREENED ELECTROMAGNETIC COIL OF RESTRICTED LENGTH HAVING OPTIMIZED FIELD AND METHOD, issued on Nov. 30, 1993. More recently acoustic shielding has been introduced, which reduces the disturbing amounts of acoustic noise associated with Lorentz forces generated by the rapid switching of high currents in the presence of large magnetic fields.

From the perspective of the diagnostic MR, and particularly MR imaging techniques, the important factors of gradient performance includes short spin and gradient echo times, high resolution, fast data acquisition rates and good spatial localization. All of these parameters rely on spatial encoding of MR signals. This is achieved by differentially evolving the phase of nuclear spins in different regions of the magnetic field. In a gradient field G(t) which varies linearly in the spatial direction S, The spin phase evolution $\psi(t)$ is given by:

$$\psi(t) = \gamma \int G(t) dt \qquad (1)$$

where $\gamma$ is the gyromagnetic ratio of the nuclei under examination. I.e., the relative evolution at any point in the field is proportional to the total integrated gradient field at that point. Thus, the performance of the gradient sub-system in terms of the amount of spin evolution per unit time it can produce is determined by the strength of the gradient field produced and the rate at which this field can be switched on and off (the rise time). The higher the gradient field and the shorter the rise time, the better the performance of the gradient sub-system.

The gradient sub-system itself is composed of two distinct components, the power supply and electromagnetic gradient coils. The performance of the gradient sub-system is determined by the limitations of the power supplies and the efficiency of the gradient coils. The requirement of short rise times conventionally requires gradient coils with minimum inductance values, which are activated with the highest voltage available. Designing such minimum inductance gradient coils has been discussed in an article by Robert Turner, entitled MINIMUM INDUCTANCE COILS, published in J. Phys. E.: Sci. Instrum., Vol. 21, Pp. 948–953, 1988. The requirement for a relatively low inductance to accommodate the short rise time, results in coils that require large currents to provide a large gradient field strength. The simultaneous requirements for high voltage and high current must be provided by the power supply.

At present there are two approaches to satisfying these high power demands. The first, employs a bank of power supplies to provide a sufficiently high current to maintain the gradient field, and a sufficiently high voltage to overcome the inherent coil inductance so as to produce a rise time that is acceptably short. The second approach employs an additional resonant circuit incorporating the gradient coil as the inductive component. The power supply is thereby relieved of the task of totally energizing the magnetic field and has only to replenish the resistive losses.

Presently, the power requirements on existing resonant gradient systems are such that the values of the electrical components are fixed. Consequently, this fixes the period of the resonant gradients. Although, resonant gradient power supplies provide higher gradient strengths and shorter rise times than conventional power supplies, such supplies do not provide a great deal of flexibility. Thus, resonant gradient power supplies are presently restricted for use in high speed Echo Planar Imaging (EPI).

The lack of flexibility of the gradient power supply is one of the main technological limitations of present MR systems. Presently, existing MR systems are upgraded by purchasing additional power supplies and/or replacing the gradient coils.

By designing gradient coils with a higher inductance specifically for use with resonant power supplies, gradient performance can be greatly improved, power requirements reduced considerably and flexibility restored. This in turn will improve the performance of MR systems. In particular, by purposefully manufacturing resonant electromagnetic gradient coils in the proposed manner, the power requirements for the MR system are substantially reduced (<<50%) over the present technology, and considerably higher field strengths can be achieved in shorter times.

It is therefore, an object of the present invention to provide a gradient coil having a substantially higher inductance to increase performance and decrease power consumption in existing resonant gradient power supplies utilized in Magnetic Resonance Systems.

SUMMARY OF THE INVENTION

A magnetic resonance system of a type including a main coil and a gradient coil. The gradient coil having at least two segments and an inductance value that is greater than twice the minimum value for a given gradient coil size and geometric configuration.

BRIEF DESCRIPTION OF THE DRAWINGS

The above objects, further features and advantages of the invention are described in detail below in conjunction with the drawings, of which.

DETAILED DESCRIPTION OF THE DRAWINGS

Figure 1:
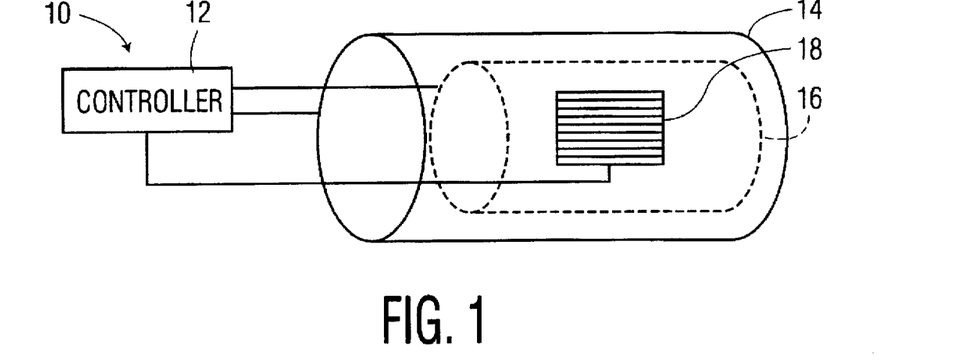
FIG. 1 is a simplified diagram of a MR system.

Referring to FIG. 1, there is shown a simplified diagram of a MR system 10. The MR system 10 includes a main magnet 14 that provides a relatively large static magnetic field. This magnetic field polarizes specific nuclear spins contained in the tissue being examined. The MR system further includes three gradient coils made in accordance with the present invention as will be explained later in greater detail. The three gradient coils in this figure are represented by a single coil 16. The gradient coils 16 superimpose three linear gradient fields in the three orthogonal spatial directions on the static magnetic field. The gradient coils 16 are driven by power supplies which are not shown. Within the gradient coil 16 is an RF resonator or antenna 18.

The RF resonator 18 delivers an RF pulse to excite specific nuclear spins in the tissue being examined. The RF resonator 18 frequently is also employed to pick up signals from the excited spins which are used to produce an image of the tissue. Alternatively, a second RF coil is employed to receive these signals. Coupled to the main magnet 14, gradient coils 16 and RF resonator 18 is a controller 12. The controller 12 operates the system by providing the necessary control signals. The controller 12 further processes the information received from the RF resonator 18 to generate images.

The MR system 10 utilizes the advantages of employing gradient coils having a substantially higher inductance in conjunction with resonant and multi-resonant power supplies. These advantages include considerable reduction in power requirements, extension of the use of resonant gradient coils technology for the whole range of MR techniques and substantial reduction in acoustic noise that can be achieved with resonant technology.

The theory presented here is equally applicable to parallel and series resonant circuits. It is also equally applicable for use with power supplies that employ either single or multi-resonant circuitry.

Figure 2:
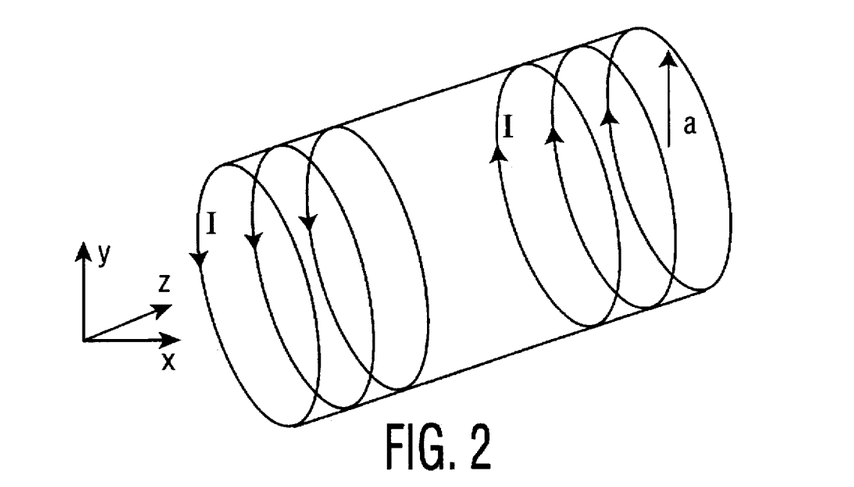
FIG. 2 is an example of an axial gradient coil.
Figure 3:
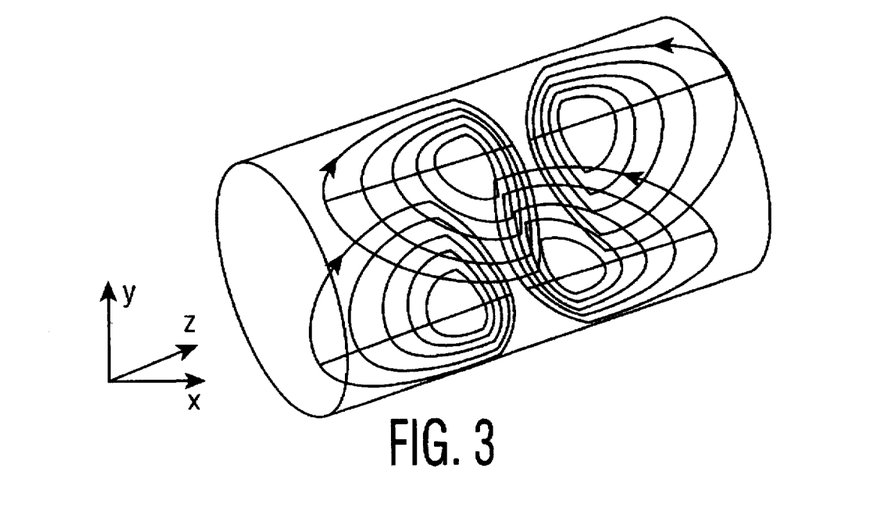
FIG. 3 is an example of a transverse gradient coil.

For a given coil the strength of the gradient field G(t) at a time (t) is given by:

$$G(t) = aI(t)n \qquad (2)$$

where a is a constant determined by the geometry of the coil structure, I(t) is the current in the coil at time t and n is the number of turns on each coil segment. Typically, electromagnetic coils consist of several segments which are distinguished by the angular direction of current flow within, spatial separation and a self inductance which is very much greater than the mutual inductance between the different segments. For example, MR gradient coils typically consist of two such segments for an axial coil as shown in FIG. 2, and four such segments for a transverse coil as shown in FIG. 3. Frequently, all of the segments are electrically identical. Of primary importance in the determination of the electrical properties of a coil is the number of complete current circuits, or turns, on each of these segments.

Equation 1 on page 4 and Equation 2 on page 9 show that the spin evolution is directly proportional to the total integrated current flowing in the coils. Thus, the larger the current, the more rapidly this current can be established and the greater the number of turns in the structure, the greater the evolution achieved in a given time. This is the crucial factor in the majority of MR techniques, particularly those requiring short echo times (both gradient and spin), short imaging times (EPI) and spectroscopic and imaging techniques requiring high degrees of spatial localization.

Figure 4A:
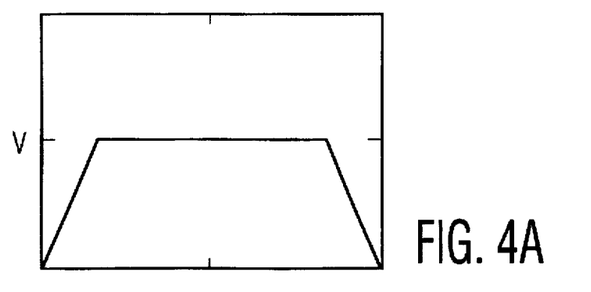
FIG. 4A is a waveform diagram of a gradient current ramped linearly.
Figure 4B:
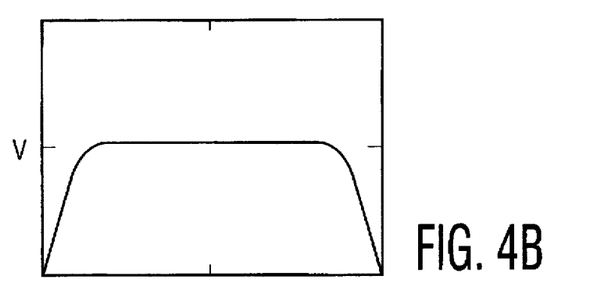
FIG. 4B is a waveform diagram of a gradient current ramped sinusoidally.

In conventional gradient systems, the gradient field is either ramped linearly as shown in FIG. 4A or sinusoidally as shown in FIG. 4B. In either case the gradient field is ramped rapidly to a constant value where the relative spin evolution is a linear function of time. This simplifies the processes of selective RF excitation and data sampling, but entails a penalty in that the time to establish and remove the field (the rise time $t_r$) is wasted. This time can be utilized by appropriately tailoring the RF pulses along with either non-linear sampling or post processing the data. Presently, for the majority of MR techniques this is the exception rather than the norm.

The time required to change the field, or equivalently the current in a coil, is a crucial factor in this process. In conventional systems, the rise time ($t_r$) is proportional to characteristic time of coil ($t_c$), which is given by:

$$t_c \approx 32\ L/R \tag{3}$$

Where L is the inductance and R the resistance of the gradient coil. Short rise times require coils that have as low an inductance as possible. Consequently, the prior art has specifically designed coils to have a minimum inductance.

The general inductance (L) for a coil is given by the equation:

$$L = bn^2 \tag{4}$$

where b is again constant determined by the geometry of the coil structure and n is the total number of turns of the coil. The requirement for low inductance has resulted in the construction of coils with the minimum number of turns. These in turn (from equation 2) require high currents to provide the necessary electromagnetic field strength.

The rate of change of current in a coil is also related to the voltage applied as follows:

$$dI/dt = V/L \tag{5}$$

To satisfy the conditions of high gradient field strength and short rise times, gradient systems require power supplies that can simultaneously provide both high voltage and high current. This implies that the power requirements are as large, as the power requirements (P) given by:

$$P = \int V(t) I(t) dt \tag{6}$$

One prior art method of improving the performance of such systems has been to employ resonant power supplies with existing low inductance coils. Such resonant power supplies consist of a conventional AC power source coupled to a resonant circuit, in which the inductive component is a gradient coil.

Figure 5:
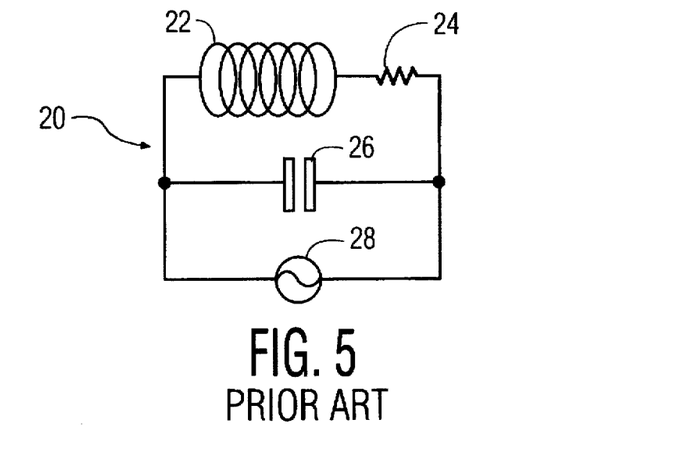
FIG. 5 is a schematic of a prior art parallel resonant gradient power supply.

An example of a parallel resonant gradient power supply is shown in FIG. 5. The parallel supply 20 includes an AC source 28 which provides an AC signal. Coupled across the AC source 28 is a capacitor 26 in parallel with a gradient coil 22 that possesses an inductive component and resistive component 24. When an AC signal is applied to the parallel circuit 20, the majority of current in the circuit oscillates sinusoidally between the capacitor 26 and the gradient coil 22 at the frequency of the AC signal. Thus, the AC source 28 is thereby relieved of the task of providing the entire current in the gradient coil 22, and need only to compensate for the resistive losses in the circuit. This increases the total amount of gradient field per unit time of gradient systems significantly by increasing the total current flowing in the coil 22, while substantially maintaining the same rise times and power demands.

Figure 6:
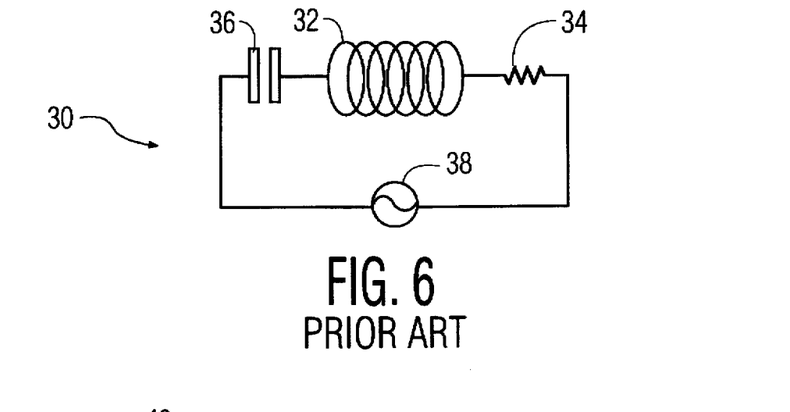
FIG. 6 is a schematic prior art series resonant gradient power supply.

An example of a series resonant gradient power supply is shown in FIG. 6. The series supply 30 also includes an AC source 38. Coupled across the AC source 38 in a series configuration is a capacitor 36, gradient coil which includes an inductive element 32 and resistive component 34. The majority of current in the series circuit 30 also oscillates sinusoidally between the a capacitor 36 and the gradient coil 32 at the frequency of the AC signal provided by the source 38.

For resonance both the parallel circuit 20 and series circuit 30 must have a capacitance (C) that satisfies the condition:

$$\begin{aligned} C &= 1/(\omega^2 L) \\ &= 1/(\omega^2 b n^2) \end{aligned} \tag{7}$$

where $\omega$ is the angular frequency ($\omega = 2\pi f$) of the current. Such a circuit has a rise time (zero to maximum field) of:

$$tr = 2\pi/(4\omega) \tag{8}$$

At resonance the impedance (Z) of the circuit is equal to the resistance (R) where:

$$Z = R = cn \tag{9}$$

and c is a constant dependent on the geometry coil, provided the resistivity (the resistance. per unit length) of the conductor remains fixed. The voltage drop (V) across the circuit is given by:

$$\begin{aligned} V &= IZ \\ &= Gac \end{aligned} \tag{10}$$

which is constant for a maximum gradient strength G. In a resonant circuit the voltage and current oscillate 90 degrees out of phase with each other, consequently, the power (P) is given by:

$$\begin{aligned} P &= VI/2 \\ &= Ga^2 c/2n \end{aligned} \tag{11}$$

EXAMPLE 1

Figure 7:
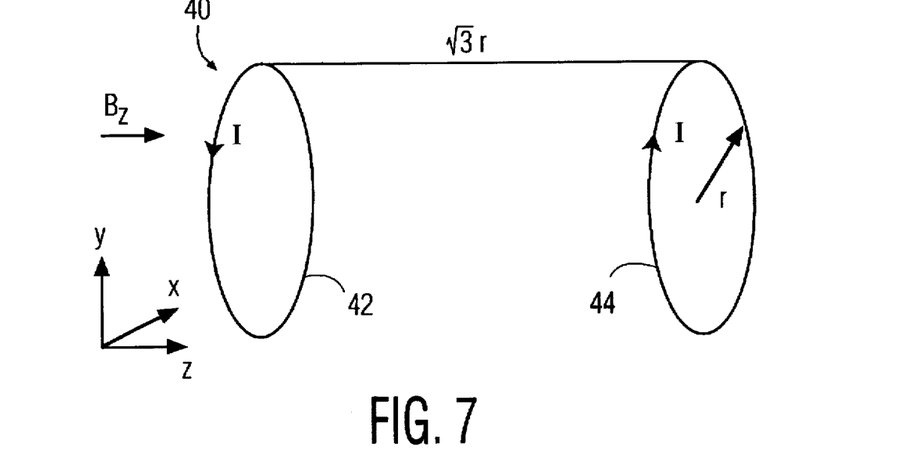
FIG. 7 is an example of a Maxwell coil for the production of a linear axial gradient magnetic field.

Referring to FIG. 7, there is shown a Maxwell Coil 40 for producing a linear axial gradient field. A Maxwell Coil 40 was assumed in which, the coil geometry, the required axial gradient field G (dB/dz) at the center of the structure and the resistance per unit length (r) of the conductor were kept constant. Further, the coil having a radius r=0.25 meter, radial wire thickness d= 0.003 m, G=10 milli-Tesla/m at the center of the coil structure, and r=0.007 Ohms/m respectively.

A Maxwell coil 40 consists of two circular segments 42,44, which are optimized to produce a linear field at the center of the structure by nulling the third order term in the spherical harmonic expansion of the field. The strength of this linear gradient field is given by:

$$G = 0.6413 \, \mu In/r^2 \qquad (12)$$

where I is the current and μ is the permeability of the volume contained within the coil. The permeability of air is almost exactly the same as that for free space, i.e. $4\pi \times 10^7$ Newtons/m².

The two segments 42,44 of the Maxwell Coil 40 are sufficiently far apart for the mutual inductance to be small compared to the self inductance of each segment. Therefore, the total inductance is closely approximated by twice that of each isolated circular hoop, i.e.:

$$L = \mu n^2 r [ln(16r/d) - 2] \qquad (13)$$

where d is the radial wire thickness. As the mutual inductance is also a constant fraction of self inductance, its effect is only to fractionally scale the following results. This does not in any way affect the inferences drawn from the results.

Figure 8:
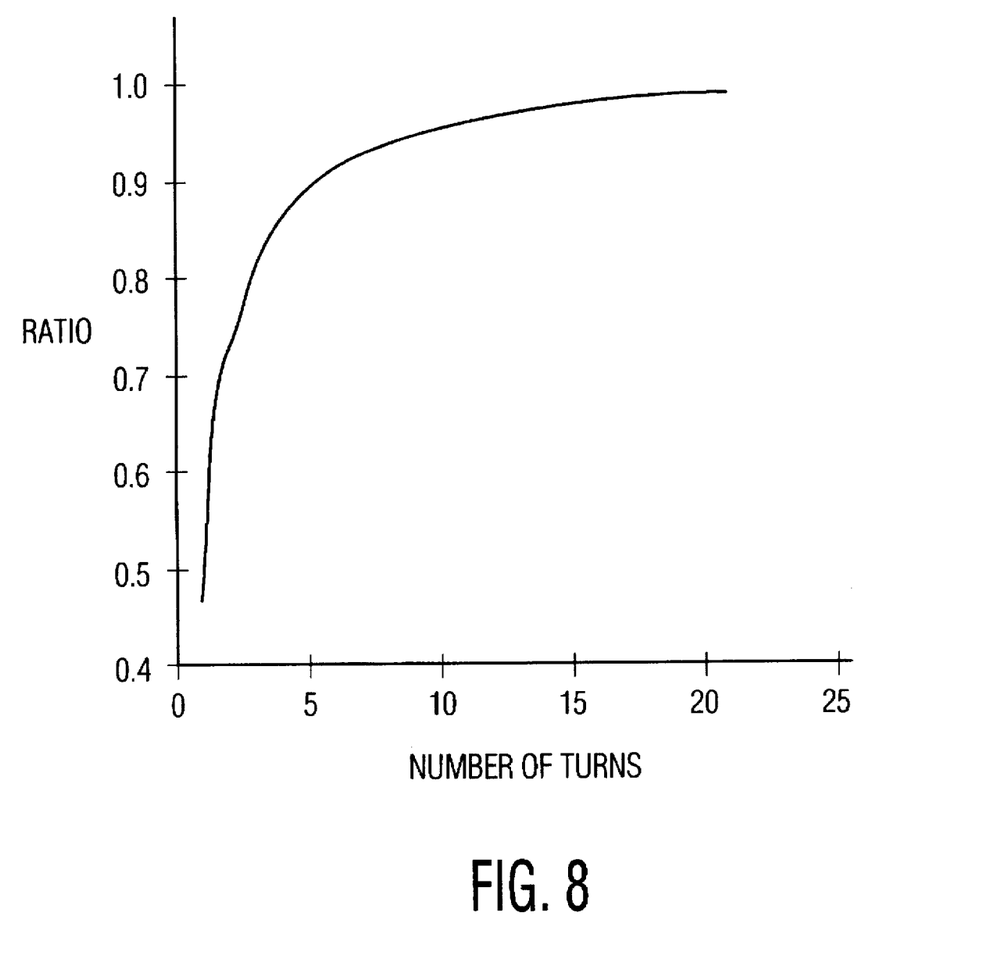
FIG. 8 is a graph of the ratio of the power requirements of the series circuit of FIG. 6 to parallel circuit of FIG. 5.

Referring to FIG. 8, there is shown a graph of the ratio of the power requirements of the series resonant circuit of FIG. 6 to the parallel resonant circuit of FIG. 5. For a low number of turns the series resonant circuit significantly out performs the parallel circuit. As the number of turns increases this ratio rapidly approaches an asymptote of 1, where the performance is almost identical. So for even moderate numbers of turns there is little difference in performance between the two circuits. As the present invention relies on the employment of large number of turns, the choice of series or parallel circuitry can commonly be made independently of gradient performance considerations.

Current MR techniques require the application of linear gradients in each of the three orthogonal spatial directions, over periods that typically range from 100 us to 20 ms. A convenient definition of gradient performance is therefore the total integrated gradient field over a time of 1 ms, where the gradient field is zero at t=0 and t=1 ms.

For a conventional gradient system in which the gradient field is utilized only during its constant phase, the performance (GP) is simply, $$GP = aIn(1 - 2t_r) \qquad (14)$$

For a 1 ms gradient pulse, this has a maximum when $t_r = 250$ us with a corresponding plateau time of 500 us. In practice, other constraints (such as the exact values of the coil inductance, the output of the power supply and even the fixed band widths of the receiver, etc.) influence the exact choice of timing, and typically rise times range from 100 us to 1 ms.

Equation 11 shows that the power requirement of a resonant circuit is inversely proportional to the number of turns on the coil. Consequently, by designing gradient coils specifically for use with resonant gradient power supplies, a considerable reduction over existing systems can be achieved in gradient power requirements providing similar performance. In practice, the construction of these coils is simply a matter of employing greater numbers of turns on the segments that comprise the gradient coil. From equation 4 we see that this will substantially increase the inductance.

Increasing the inductance is contrary to the present philosophy of employing coils of minimum inductance for all gradient systems. The reason for this is that the rise time for resonant gradient systems (equation 8) is independent of the inductance, while the rise time of conventional systems is proportional to the characteristic time and hence the inductance (equation 2). This last argument assumes that an appropriate capacitance is employed to maintain the rise time of the circuit.

Further, using higher inductance coils enables the use of a lower value capacitor (equation 7). A lower value of capacitance can be fabricated with a lower equivalent series resistance, thereby reducing power loss in the circuit. This also makes it feasible to employ variable and switchable capacitors in resonant gradient systems, removing the fixed frequency limitation of the present resonant technology and permitting resonant gradients to be employed in the full gamut of MR techniques. Presently, resonant gradient technology is limited to single frequency use in high speed echo planar imaging.

EXAMPLE 2

Maxwell coils have been extensively employed in MR systems. Once such coil with the dimensions of that of Example 1 has been used in echo planar imaging. This particular coil has 8 turns on each of the two segments, an inductance of approximately 200 μH and is driven conventionally with trapezoidal gradients in a manner close to that which would provide optimum performance as defined by equation 14. By constructing a coil of similar dimensions with three times the number of turns, the performance increases by 183% for the same power input. Alternatively, for the same performance the power requirements are reduced to 35% of the conventionally designed coil.

Equation 11 implies that the power requirements can be reduced to arbitrarily low values by the construction of coils with sufficient numbers of turns. Unfortunately, this simple theory does not take into account the self capacitance of the coil. As the inductance increases with the number of turns, so to will the total self capacitance. Therefore the system is self limiting at the point at which it becomes self resonant; i.e. when the resonance condition is satisfied by the systems self inductance and capacitance.

In addition, at some point the length of the coil will be a significant fraction of the wavelength of the resonant current. The resultant magnetic field, will then possess a significant time dependent spatial differential across the utilizable volume and obviating its use for extremely sensitive MR studies. In the above example, it was assumed that the resistivity per unit length of conductor was constant. Consequently, the volume of the conductor employed limits the performance that can be achieved in practice.

Despite these limitations the use of high inductance resonant gradient coils results in a considerable reduction of gradient power requirements (<<50%). Furthermore, it is relatively simple to greatly increase the inductance by manufacturing coils with many more turns than are currently employed. Such high performance distributed coils have the additional advantage of approximating continuous current distributions more closely, with an associated improvement of the coil's quality (the degree to which the coil's field approximates the optimum continuous distribution.

Figure 4C:
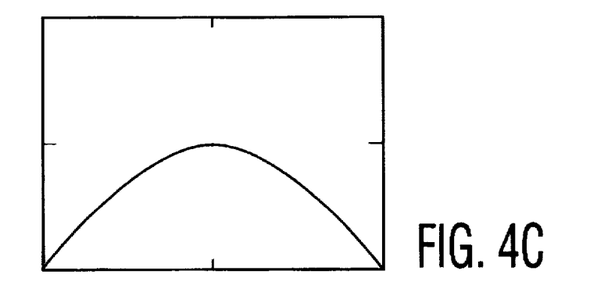
FIG. 4C is a waveform diagram of a sinusoidal gradient current.

Conventional drive technology provides a substantially flat current portion (v) of the gradient current waveform as shown in FIG. 4A and FIG. 4B. Consequently, the electromagnetic fields produced are constant with time providing a period in which the phase of MR spins evolve linearly. Furthermore, the requisite sampling and post processing are also linear. This simplicity is lost with resonant technology because curvilinear currents are produced in the coils as shown in FIG. 4C. Such curvilinear currents complicate sampling and post processing.

There are a number of ways to deal with the complications that arise from curvilinear currents. The post processing can be modified to accommodate any general curvilinear phase evolution produced by the corresponding curvilinear current. Alternatively, appropriate non-linear sampling can be employed to re-linearize the phase evolution, permitting the use of conventional linear post processing.

It is also possible to employ multi-mode resonant circuitry capable of simulating conventional trapezoidal gradient current waveforms (FIG. 4D) to any desired degree of accuracy. This solution also provides for more efficient use of time, as the more rectangular a gradient wave form of a given amplitude, the greater the phase evolution per unit time. In conjunction with high inductance resonant coils, multi-mode resonant circuitry provides both higher gradient wave form amplitudes and more efficient use of the available time. The disadvantage of multi-mode resonant circuitry is the increased complexity of the circuitry, particular if variable frequencies are required.

Resonant circuitry can also be employed to provide fast half sinusoidal ramps in conjunction with conventional power supplies to provide the greatly reduced currents required to maintain a flat plateau, which can be used for conventional MR operation. Again this adds to the complexity of the circuitry as the resonant capacitor must be disconnected during the period of constant current. Previously, the use of switches has been impractical at the high power ranges required in existing MR systems. With the reduction of power according to the present invention, the use of switches is feasible.

The current flowing in a resonant circuit when it is initially activated is the same as that supplied. This resonant current builds on successive oscillations of the circuit and consequently requires several cycle times to become established. The number of cycles is proportional to the resonant current of the circuit (Q), which is the ratio of the resonant current to that which must be provided by the power supply to compensate for resistive loses. This is given by:

$$Q = \omega L / R \qquad (15)$$

Besides requiring considerable time (several resonant periods), the current flowing coil would produce an oscillating field of increasing amplitude with time. For some applications this is desirable (e.g. spiral imaging), while for most techniques this poses a serious problem. Previously this has been circumvented by establishing the current in a second coil of equal inductance to that of the gradient coil that is in circuit with the capacitance, and then switching the gradient coil for the second coil when the gradient is required.

Acoustic noise from gradient coils in MR systems is a major problem. Two mechanisms give rise to this acoustic noise. These are: low frequency gross motion of the coil structure arising from the large forces acting over considerable fractions of the lengths of the structures; and the high frequency micro-motions of the individual conductor loops. The problem of noise from gross motions has been solved previously by the development of force compensated coils. While the total forces experienced by the coil structures of these new high inductance coils remains the same for a given gradient performance, in distributed designs the current and hence the forces on each current loop is considerable reduced. Accordingly, the acoustic noise from the micro motion is reduced. Additionally, resonant gradient wave forms are intrinsically less noisy, as they do not possess the sharp current transitions at the edges of trapezoidal wave forms that give rise to the high frequency acoustic noise.

These high performance resonant coil designs can be used in conjunction with existing electromagnetic design paradigms. Therefore, coupling the gradient coils of the present invention with force shielding serves to further reduce the acoustic noise. Additionally, the higher performance can be utilized to provide the additional power required by the intrinsically higher inductance of force shielded coils.

For distributed electromagnetic coil designs, the use of additional turns can simultaneously be used to improve the approximation of any practical embodiment to the continuous distribution. This improves the degree with which the magnetic field approximates the required one, in particular, in that region that lies in close proximity to the coil structure where the local discrete current densities dominate the magnetic field.

Figure 10:
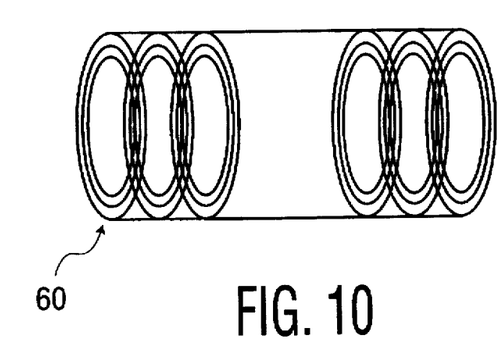
FIG. 10 is a schematic of a second embodiment of the gradient coil having a substantially higher inductance according to the present invention.
Figure 11:
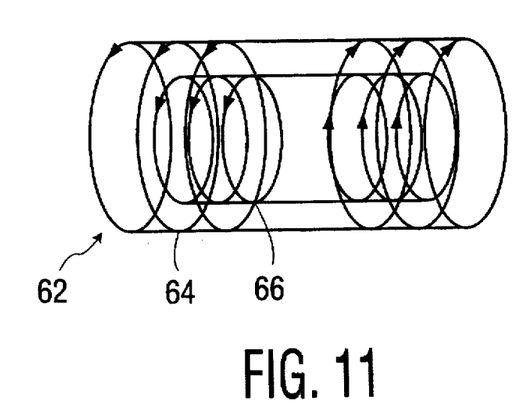
FIG. 11 is a schematic of a third embodiment of the gradient coil having a substantially higher inductance according to the present invention.
Figure 12:
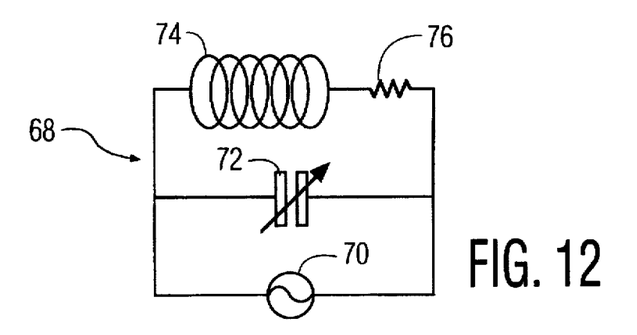
FIG. 12 is a schematic of a first embodiment of the gradient sub-system according to the present invention.

As discussed earlier, purposefully fabricating gradient coils with a higher inductance reduces the power requirements and increases performance of MR systems over the present technology. In contrast, the present technology purposely employs gradient coils which have a minimum inductance for a given size coil. In order to obtain the advantages of the higher inductance values, the gradient coils of the present invention have an inductance value of greater than twice the minimum inductance calculated for a given size coil and configuration. Designing gradient coils to have a minimum inductance value is well known in the art and disclosed in the previously discussed article by Robert Turner, entitled MINIMUM INDUCTANCE COILS. Thus, designing gradient coils having twice the minimum inductance value are readily designed and fabricated by utilizing the methods disclosed herein. FIGS. 10–12 show a number of different embodiments of a gradient coil having greater than twice the minimum inductance according to the present invention.

Figure 9:
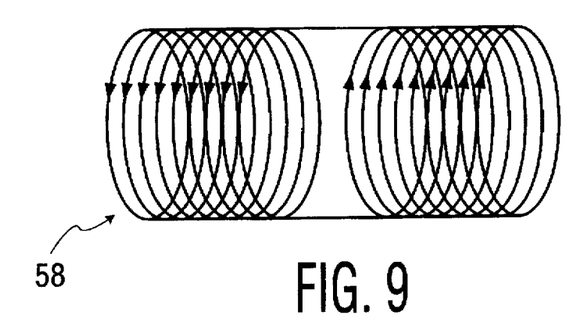
FIG. 9 is a schematic of a first embodiment of the gradient coil having a substantially higher inductance according to the present invention.

Referring to FIG. 9, an embodiment of the gradient coil 58 having greater than twice the minimum inductance is shown. In this embodiment, the greater inductance value is achieved by increasing the number of turns of the gradient coil 58. The number of turns are increased by winding additional turns at intermediate positions between those of the conventional low inductance coils.

Referring to FIG. 10, there is shown another embodiment of the gradient coil 60 having greater than twice the minimum inductance. In this embodiment, the greater inductance value is achieved by increasing the number of turns of the gradient coil 60. The number of turns are increased by winding additional turns proximal to those of the conventional low inductance coils.

Referring to FIG. 11, a further embodiment of the gradient coil 62 having greater than twice minimum inductance 62 is shown. In this embodiment, the greater inductance value is achieved by winding a second coil assembly 66 within a conventional minimum inductance coil 64.

The performance of the gradient coils of FIGS. 9–11 can be improved by including magnetic as well as acoustically screening. Examples of a magnetic screening process is disclosed in U.S. Pat. Nos. 4,978,920 and 5,266,913, the disclosures of which are incorporated herein by reference.

The gradient coils of FIGS. 9–11 are intended to be utilized in gradient sub-systems utilizing resonant circuitry. FIGS. 12–15 show a number of different embodiments of gradient sub-systems utilizing these higher inductance coils.

Referring to FIG. 12, there is shown a first embodiment of a gradient sub-system 68 made according to the present invention. In this embodiment the resonant circuit portion of the sub-system 68 is in a parallel configuration. The sub-systems 68 is essentially the same as the parallel gradient power supply 20 of FIG. 5, except for the gradient coil 74 and variable capacitor 72. The gradient coil 74 as previously discussed has an inductance greater than twice that of the minimum inductance for a given coil size. The use of such a gradient coil 74 substantially reduces power consumption and increases performance of the gradient power supply 68.

The use of a variable capacitor 72 in the gradient sub-system 68 is made possible by the reduced power requirements related to the gradient coil 74 having a higher inductance. The variable capacitor 72 enables the resonant frequency of the power supply 68 to be varied so that the power supply 15 can be utilized with an AC source 70 of any frequency. This permits the full range of MR techniques to utilize the high performance provided by the present invention.

Figure 13:
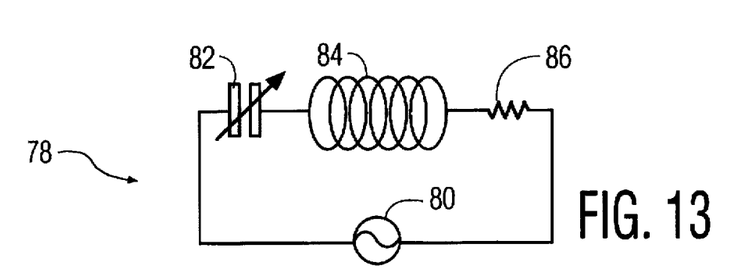
FIG. 13 is a schematic of a second embodiment of the gradient sub-system according to the present invention.

Referring to FIG. 13, a second embodiment of a gradient sub-system 78 according to the present invention is shown. In this embodiment the resonant circuit portion of the sub-system 78 is in a series configuration. The sub-system 78 is essentially the same as the serial gradient power supply 30 of FIG. 6, except for the gradient coil 84 and variable capacitor 82. The gradient coil 84 as previously discussed also has an inductance that is greater than twice that of the minimum inductance for a given coil size and geometry, which reduces power consumption and increases performance of the gradient sub-system 78. The variable capacitor 84 also enables the resonant frequency of the gradient sub-system 78 to be varied.

The resonant frequency of the gradient sub-system of FIGS. 12 & 13 can be varied by other configurations. A first alternative configuration is to replace each variable capacitor with a network of capacitors coupled together by switches for switching the network of capacitors into different series and parallel configurations to vary the overall capacitance of the network.

A second alternative configuration is to vary each inductive element. This is accomplished by either fabricating the gradient coils 78,84 of FIGS. 12 & 13 with a variable inductance or by coupling additional gradient coils together by switches similar to FIG. 9.

Figure 14:
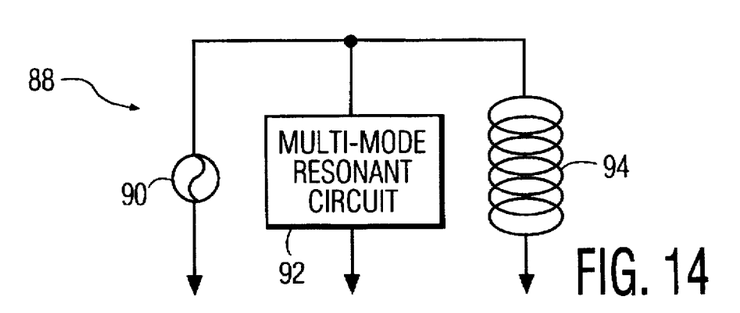
FIG. 14 is a schematic of a third embodiment of the gradient sub-system according to the present invention.

Referring to FIG. 14, a third embodiment of a gradient sub-system 88 made according to the present invention is shown. In this embodiment the resonant circuitry is a multi-mode resonant circuit. The sub-system 88 includes an AC source 90 which provides an AC signal of a pre-determined frequency. Coupled to the AC source 90 is a multi-mode resonant circuit 92, which provides the oscillating current in order to drive a gradient coil with a minimum amount of power from the AC source 90. Multi-mode resonant circuits are disclosed in detail in U.S. Pat. No. 5,324,060 to Mansfield et al., entitled COIL CIRCUITS, issued on Jun. 28, 1994, the disclosure of which is incorporated herein by reference. Coupled across the multi-mode resonant circuit 92 is a gradient coil 94 having greater than twice the minimum inductance as described earlier.

Figure 4D:
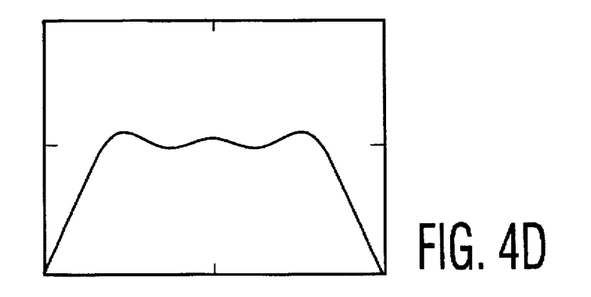
FIG. 4D is a waveform diagram of a multi-mode sinusoidal gradient current.

The multi-mode resonant circuitry 92 generates an approximation of a conventional trapezoidal current in the gradient coil 94 as shown in the wave form of FIG. 4D. The wave form of FIG. 4D has a relatively flat constant current portion similar to the wave forms produced by conventional gradient power supplies. This enables the post processing and sampling functions performed by MR systems to be linear, which is simpler to perform than the non-linear post processing and sampling required by single mode resonant circuits.

Figure 15:
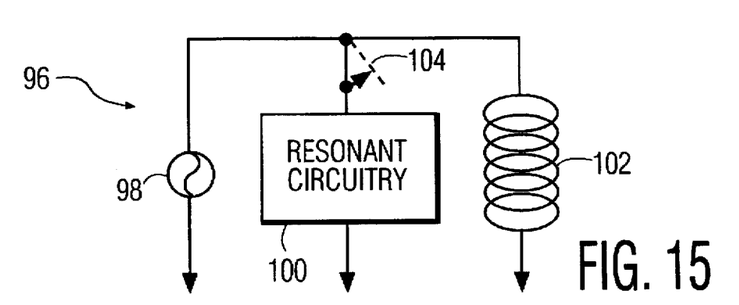
FIG. 15 is a schematic of a fourth embodiment of the gradient sub-system according to the present invention.

Referring to FIG. 15, there is shown a fourth embodiment of a gradient sub-system 96 according to the present invention. This embodiment is configured to provide a flat constant gradient current when utilizing resonant circuitry by switching out the resonant circuitry at an appropriate time. The sub-system 96 includes an AC source 98. Coupled across the AC source 98 is Resonant Circuitry 100, which consists of at least one capacitor. The Resonant Circuitry 100 is coupled to the AC source 90 by a switch 104 that has an open position and a closed position. The positions of the switch 104 are controlled by the controller 12 of the MR system of FIG. 1. Coupled also across the AC source 98 is a gradient coil 102 having greater than twice the minimum inductance value as described earlier.

When the switch 92 is in the closed position, the Resonant Circuitry 100 is coupled to the sub-system 96, thereby in conjunction with the gradient coil 102 forming either a parallel resonant circuit similar to the one shown in FIG. 5 or a series resonant circuit similar to the one shown in FIG. 6. When the switch 104 is in the open position, the Resonant Circuitry 100 is de-coupled from the sub-system 96.

At the beginning of a given cycle of operation of the gradient sub-system 96, the switch 104 is in the closed position enabling the AC source 98 to supply current to the gradient coil 102 in a resonant manner. The current in the gradient coil 102 will build up in a fast sinusoidal ramp. When the current in the gradient coil 102 reaches a maximum, the switch 104 will switch to the open position enabling the AC source 96 to supply a constant current to the gradient coil 102 in a conventional manner. By switching the circuit 96 in this fashion, a current having a wave form similar to that shown in FIG. 4B will be developed within the gradient coil 102. As discussed earlier, such a current wave form is desirable because it enables linear post processing and sampling.

Figure 16:
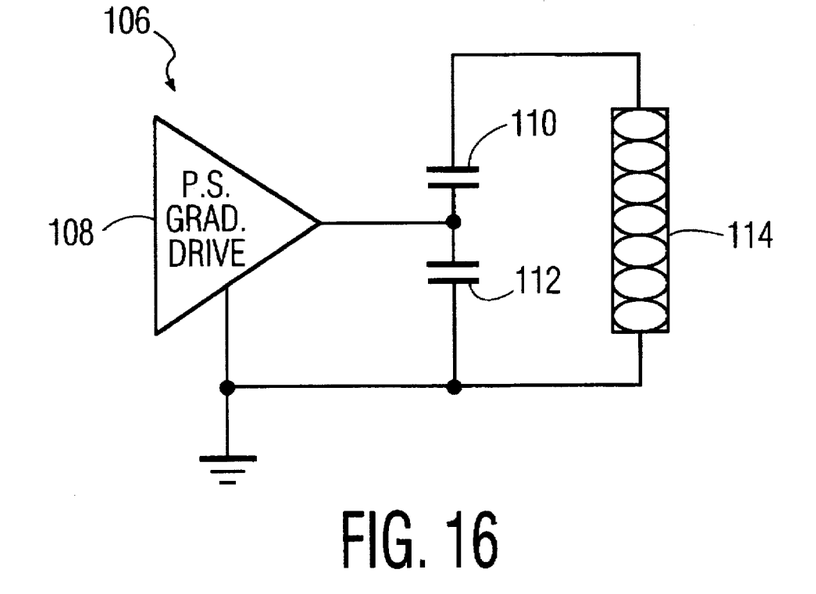
FIG. 16 is a schematic of a series-parallel circuit arrangement for an impedance matched resonant gradient drive of the gradient sub-system according to the present invention.

Referring to FIG. 16, a further embodiment of the gradient sub-system according to the present invention is shown. This embodiment 106 utilizes matched resonant circuitry as part of the gradient sub-system. In this embodiments 106, the gradient coil having greater than twice the minimum inductance 114 is in a resonant circuits isolated from the power supply 108 either all of the time or part of the time, depending on how the isolation is performed. In such a configuration, the power supply 108 is not subjected to either the high voltages, high currents or both present in the resonant circuit. The power supply operates with an optimum load impedance which can be chosen to minimize dissipation in the power supply 108 and maximize the power transfer to the gradient coil 114.

The embodiment 106 shown in FIG. 16 accomplishes the isolation by capacitively coupling the power supply 108 to the resonant circuit. This embodiment 106 includes a power supply gradient drive 108 which supplies the current to drive the gradient coil 114. The output of the power supply 108 is coupled across a capacitor 112. The gradient coil 114 and a another capacitor 110 is further coupled across the first capacitor 112 forming a series-parallel circuit. The capacitors 110,112, in effect form an impedance transformer having a load impedance ($Z_L$) given by the following approximation:

$$Z_L \approx 1/R(C_1/C_2)^2 (\omega L)^2 \qquad (15)$$

where, $C_1$ is the capacitance value of capacitor 110, $C_2$ is the capacitance value of capacitor 112, R is the resistance of the gradient coil 114, and L is the inductance of the gradient coil 114.

The above transformation may also be performed with a parallel-series circuit configuration. In this manner, the circuits are permanently decoupled in that there is no direct current flow to the gradient coil 114 during operation. During operation, this embodiment 106 can only operate in a resonant mode, as it cannot function in a conventional direct current mode for prolonged periods.

Figure 17:
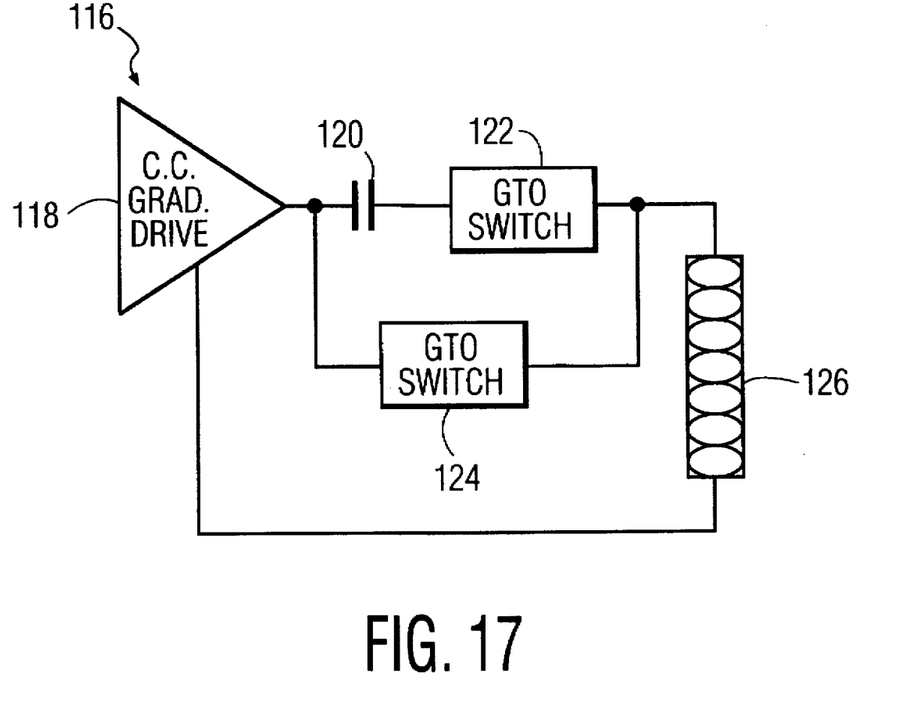
FIG. 17 is a schematic of a resonant gradient drive circuit utilizing switch elements to provide direct current through the coil of the gradient sub-system according to the present invention.

Referring to FIG. 17, there is shown a still further embodiment of the gradient sub-system according to the present invention. In this embodiment 116, the isolation is accomplished by a combination of switches 122,124 and a tune capacitor 120. This enables the Constant Current Gradient Drive 118 to drive current directly through the resonant circuit, resonantly or in any combination of the two depending upon the dynamic application of the switches 122,124. In all combinations, the power supply 118 provides for the resistive losses in the entire combined circuit. This embodiment 116 may be combined with the embodiment 106 of FIG. 16 with the appropriate connection of switches.

Still Referring to FIG. 17, this embodiment 116 includes a Gradient Drive coupled to one side of the capacitor 120 and switch 124. The other side of the capacitor 120 is coupled to the gradient coil having greater than twice the minimum inductance 126 through another switch 122. While the other side of switch 124 is directly coupled to the coil 126. The switches 122,124 preferably are semiconductor devices such as Gate Turn off Thrystors or Insulated Gate Bipolar Transistors.

During operation, the Gradient Drive can drive the gradient coil conventionally when switch 122 is open and switch 124 is closed. Conversely, the gradient coil 126 can be driven resonantly when the switches positions are reversed. Also, the coil 126 can be driven in a combination mode when both switches 122,124 are closed. This variant is particularly suited to low cost imaging systems or enhancements which enable the user to perform Echo-planar or Spiral-Scan like sequences.

While the invention has been particularly shown and described with reference to preferred embodiments thereof, it will be understood by those skilled in the art that changes in form and details may be made therein without departing from the spirit and scope of the present invention.

What is claimed is:

1. A magnetic resonance system of the type including a main coil, a gradient coil and a resonant power supply having a capacitor, said gradient coil having a minimum inductance value for a given size gradient coil and said resonant power supply providing a current to said gradient coil at a given resonant frequency determined in part by said minimum inductance value of said gradient coil and capacitance of said capacitor, the improvement therewith comprising:

said gradient coil having an inductance which is greater than twice said minimum inductance value thereby enabling said capacitance of said capacitor to be reduced for said given resonant frequency.

2. The system of claim 1, wherein said gradient coil has a parallel plate configuration.

3. The system of claim 1, wherein said gradient coil has a cylindrical configuration.

4. The system of claim 1, wherein said greater than twice the minimum inductance is achieved by increasing the number of windings in said gradient coil.

5. The system of claim 1, wherein said gradient coil has magnetic shielding.

6. The system of claim 1, wherein said gradient coil has acoustical shielding.

7. A gradient sub-system for a MR system of the type including a resonant circuit and at least one cylindrical gradient coil providing inductance of said resonant circuit, wherein said gradient coil is configured to have a minimum inductance value for a given size gradient coil, the improvement therewith comprising:

said gradient coil having an inductance which is greater than twice said minimum inductance value.

8. The sub-system of claim 7, wherein said at least one gradient coil has magnetic shielding.

9. The sub-system of claim 7, wherein said at least one gradient coil has acoustical shielding.

10. The sub-system of claim 7, wherein said at least one gradient coil is one gradient coil having a variable inductance.

11. The sub-system of claim 7, wherein said resonant circuit is a series resonant circuit having at least one capacitor coupled in series with said at least one gradient coil.

12. The sub-system of claim 11, which further comprises means for de-coupling said at least one capacitor from said at least one gradient coil when a current in said at least one gradient coil reaches a maximum operating value.

13. The sub-system of claim 11, wherein said at least one capacitor is a variable capacitor.

14. The sub-system of claim 11, wherein said at least one capacitor is a network of capacitors coupled together by switches, said switches for switching said network of capacitors into different configurations to vary the overall capacitance of said network of capacitors.

15. The sub-system of claim 7, wherein said resonant circuit is a parallel resonant circuit coupled in series with said at least one gradient coil and at least one capacitor coupled across said at least one gradient coil.

16. The sub-system of claim 15, which further comprises means for de-coupling said at least one capacitor from said at least one gradient coil when a current in said at least one gradient coil reaches a maximum operating value.

17. The sub-system of claim 15, wherein said at least one capacitor is a variable capacitor.

18. The sub-system of claim 15, wherein said at least one capacitor is a network of capacitors coupled together by switches, said switches for switching said network of capacitors into different configurations to vary the overall capacitance of said network of capacitors.

19. The sub-system of claim 7, wherein said resonant circuit is a multi-mode resonant circuit.

20. The sub-system of claim 7, wherein said resonant circuit includes two capacitors coupled to said at least one cylindrical gradient coil in a series parallel configuration.

21. The sub-system of claim 7, wherein said resonant circuit includes a capacitor coupled to said at least one cylindrical gradient coil through a first switch, said resonant circuit further including a second switch coupled across both said capacitor and said first switch.

22. The sub-system of claim 7, wherein said resonant circuit is part of an impedance transformation circuit.

* * * * *